United States Patent
Mickievicz et al.

(10) Patent No.: US 6,963,494 B2
(45) Date of Patent: Nov. 8, 2005

(54) BLIND HOLE TERMINATION OF PIN TO PCB

(75) Inventors: Scott Keith Mickievicz, Elizabethtown, PA (US); John Edward Knaub, Etters, PA (US)

(73) Assignee: ITT Manufacturing Enterprises, Inc., Wilmington, DE (US)

( * ) Notice: Subject to any disclaimer, the term of this patent is extended or adjusted under 35 U.S.C. 154(b) by 58 days.

(21) Appl. No.: 10/461,840

(22) Filed: Jun. 13, 2003

(65) Prior Publication Data

US 2004/0251046 A1 Dec. 16, 2004

(51) Int. Cl.[7] .............................. H05K 1/11; H05K 1/14
(52) U.S. Cl. ...................... 361/795; 361/785; 257/774; 439/83; 438/620
(58) Field of Search .................... 361/795, 792, 361/794, 772–774, 782–784, 760, 720; 257/678, 774; 174/252, 266, 255, 162, 260–264; 439/83, 78; 438/620, 209; 29/831, 846, 847

(56) References Cited

U.S. PATENT DOCUMENTS

| | | | | | |
|---|---|---|---|---|---|
| 3,301,939 | A | * | 1/1967 | Krasnow | 174/266 |
| 3,875,479 | A | * | 4/1975 | Jaggar | 361/792 |
| 5,046,957 | A | * | 9/1991 | Millhimes | 439/83 |
| 5,363,280 | A | * | 11/1994 | Chobot et al. | 361/794 |
| 5,543,586 | A | * | 8/1996 | Crane et al. | 174/262 |
| 6,522,014 | B1 | | 2/2003 | Egitto et al. | 257/774 |

* cited by examiner

Primary Examiner—Kamand Cuneo
Assistant Examiner—Hung S. Bui
(74) Attorney, Agent, or Firm—Roger C. Turner

(57) ABSTRACT

Tails (20) projecting from an electrical component (12) that lies on a circuit board surface, are terminated to traces on a multi-layer circuit board (14) in a manner that minimizes the disadvantages of long through hole soldering and of surface mount techniques. A blind hole is drilled and plated in a first layer (31) that will become the topmost layer of the stack, to form a shallow well (70). The well is filled with a soldering composition (130). A tail (20) is projected downward into the soldering composition, and the soldering composition is heated to solder the tail to the hole plating.

2 Claims, 2 Drawing Sheets

BLIND HOLE TERMINATION OF PIN TO PCB

BACKGROUND OF THE INVENTION

Components that lie on a circuit board typically have leads or tails that must be soldered to traces on the circuit board. One technique for mounting the tails includes drilling holes through the circuit board, plating the holes and then fixing the tails in the holes. The tail can be a compliant pin which is forced into the hole in an interference fit, or can be soldered in place with the solder joined to tail portions that project from opposite ends of the hole. When a multi-layer circuit board assembly is used, the through holes extending the board assembly are long and tails to be soldered in the holes must be long. This results in considerable capacitance between the plated walls of the hole and close traces on the laminates, or layers of the assembly, and results in increased crosstalk and decreased signal strength.

Another technique for soldering component tails to traces on a circuit board, is the SMT (surface mount technique) method, wherein the tails touch circuit board traces that form solder pads, and are soldered thereto. In order to achieve reliable solder joints, the tails should each touch the corresponding solder pad. This requires close tolerances and/or resilient tails. The SMT technique results in solder joints that are mechanically weak, against shear forces that tend to move the tails parallel to the plane of the board upper face and against pull up forces.

A technique for soldering component tails to platings or other traces on a multilayer circuit board, which avoided the disadvantages of high capacitive load for through-hole soldering, and which avoided the disadvantages of weakness and close tolerances or resilient tails for SMT, would be of value.

SUMMARY OF THE INVENTION

In accordance with one embodiment of the present invention, a solder connection is provided between a lead or tail of a component lying on a multi-layer circuit board arrangement and a plating on the arrangement, and a method for producing such solder connection, which avoids the high capacitance loading, low shear and tension strength, and the need for resilient or precision tails of the prior art. In a multi-board arrangement, a plated hole is formed in only the topmost layer, to form a solder well whose bottom is formed by the upper surface of a second layer that lies facewise under the first layer. The tail is inserted down into the hole and soldered in place thereat, as by a solder paste that was previously placed in the well or around the tail. The portion of the tail lying in the circuit board is short, being no more than the thickness of the first board, to avoid a significant capacitive load. However, a considerable length of the tail, such as a length that is about equal to its diameter, is firmly soldered in and above the hole, so the tail resists considerable force tending to break the solder connection. The tails do not have to be formed with high precision, since a rugged connection is achieved with tails that project different distances into the solder well. In some cases the solder well extends through a plurality of topmost layers.

The novel features of the invention are set forth with particularity in the appended claims. The invention will be best understood from the following description when read in conjunction with the accompanying drawings.

DESCRIPTION OF THE PREFERRED EMBODIMENTS

Figure 1:
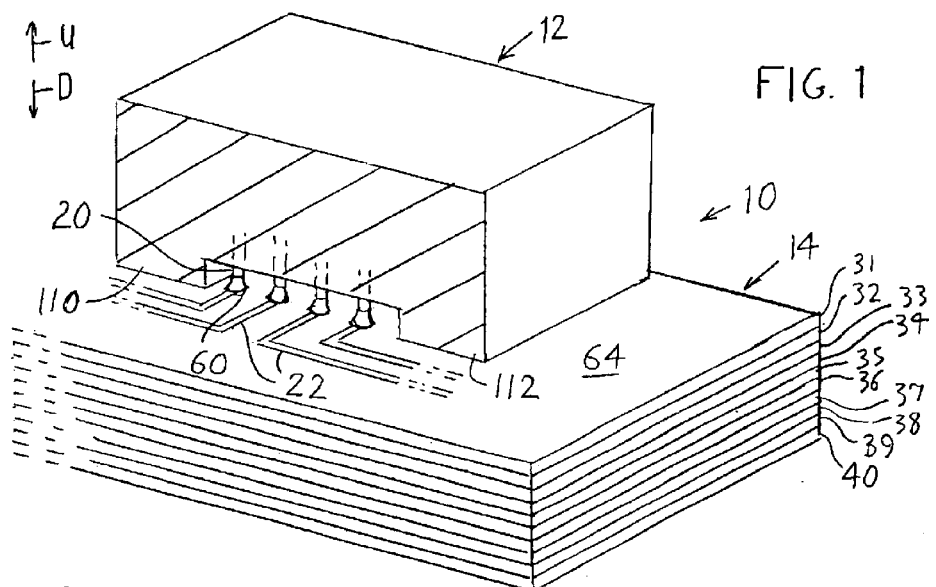
FIG. 1 is a partial isometric view of a component lying on a multi-layer circuit board assembly, and having tails soldered to traces on an uppermost first board of the assembly.
Figure 3:
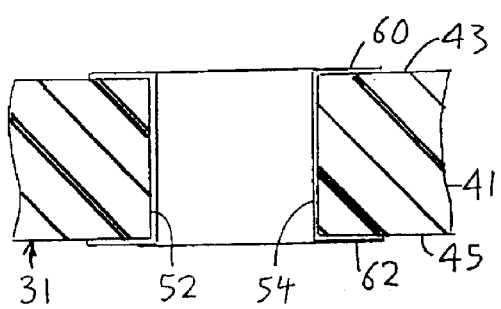
FIG. 3 is a sectional view of a portion of the first board, shown after a first step of the method of the invention.

FIG. 1 illustrates a termination system 10 of the present invention, wherein a component 12 that lies on a multi-layer circuit board assembly 14 has component pins, or leads, or tails 20 that must be soldered to traces 22 on a first layer 31 of the circuit board assembly. The particular circuit board assembly 14 includes ten layers 31–40 that lie in a facewise stack wherein each layer lies facewise adjacent to one or two other layers, to form a facewise stack of layers. Up and down directions are indicated by arrows U and D for the particular orientation of the component and board assembly illustrated in the figures, although it should be understood that the board assembly and component can lie in any orientation. As shown in FIG. 3, each layer such as 31 includes a plate 41 of insulative material. Most or all of the layers also include traces such as 60, 62 on one or both faces 43, 45 of the plate, the traces being formed of a film of conductive material.

Figure 2:
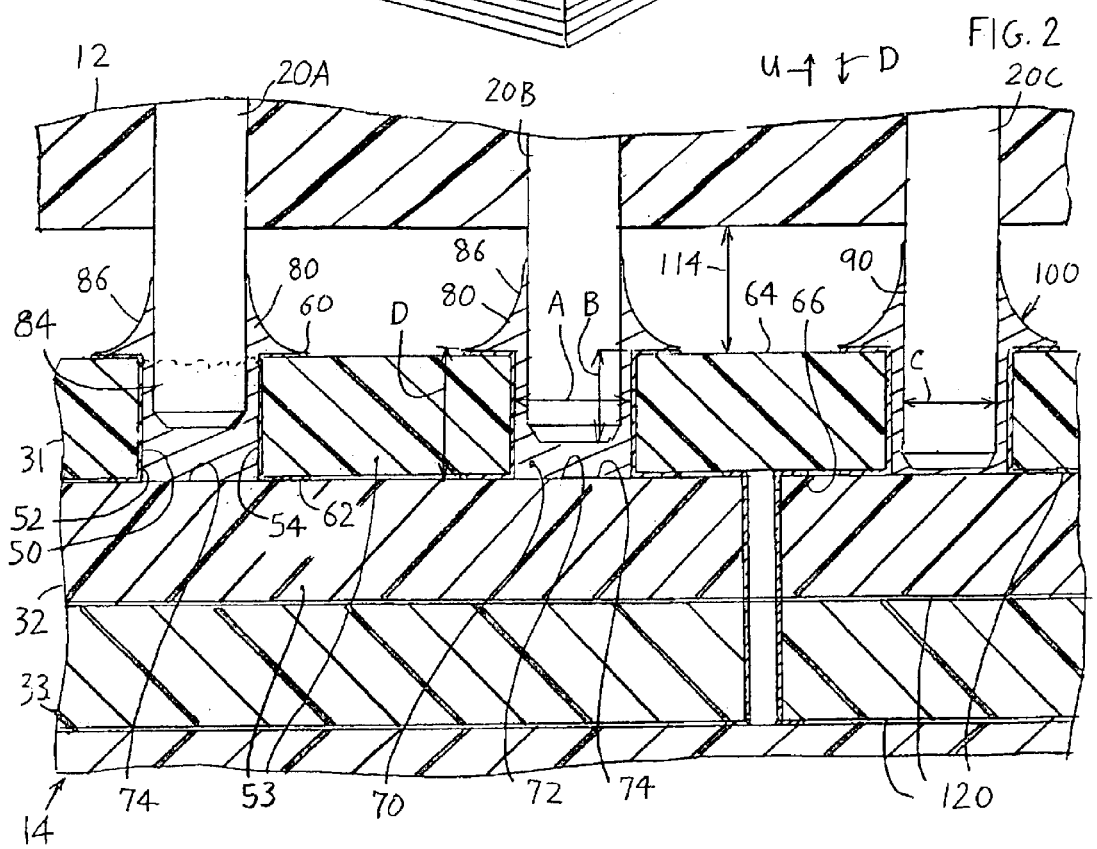
FIG. 2 is an enlarged sectional view of a portion of the component and multi-layer circuit board assembly of FIG. 1.

FIG. 2 shows that the first or uppermost layer 31 has walls forming a plated hole 50. The layer hole 52 within the plating is preferably formed, as by drilling with a drill or laser, in the dielectric or insulative substrate 53 that forms most of the layer. After drilling, a plating is applied that includes a hole plating portion 54 and top and bottom face traces parts 60, 62 that lie on upper and lower faces 64, 66 of the substrate of the first layer. As shown in FIG. 1, the upper face trace parts 60 merge with the rest of each trace 22 that extends from a hole to other circuitry on the circuit board.

Each hole 50 of FIG. 2 forms a solder well 70 whose well lower wall 72 is formed by an upper face 74 of the second layer 32. Thus, the well has bottom and side walls, so it can contain solderable material during a soldering operation when the solder is flowable. A lower tail end portion 84 of each component tail projects into one of the plated holes 50 and is soldered by the solder 80 lying in the well and displaced and attracted by capillary action to lie above the well. In the soldering operation, the solder forms a fillet 86 that adheres to the top face plating part 60 and to portions 90 of the tail.

The solder connection 100 formed between the tail end portion 84 that projects into and moderately above the solder well 70 and the plating on the walls of the hole and on the upper surface of the first layer, provides a rugged joint of minimal capacitance. The small capacitance is due to the short length B of the tail that lies within the multi-layer circuit board assembly 14, the length B being no greater than the thickness D of the first layer 31. The very small thicknesses of the face traces 60, 62 can be considered part of the thickness D of the board. The resistance of the tails to upward U pullout is much greater than for a surface mount solder connection, and almost as great as that for a very long tail that extends through the entire thickness of the multi-board circuit board assembly 14. The resistance to damage when the component tends to move laterally L relative to the circuit board assembly is much higher than for an SMT connection and almost as high as for a tail that extends completely through the circuit board assembly.

The component 12 shown in FIG. 1 has standoffs 110, 112 that leave a space 114 (FIG. 2) above the first layer upper face 64. This leaves room for the solder fillets 86 and leaves room for washout fluid to clean the solder connections and possibly to allow observance of the solder connections for defects.

The length of each tail 20 should be about the same, but with large tolerances allowed. In FIG. 2, the tails 20A, 20B, 20C are of different lengths. The tail 20A extends a minimal distance into the hole 50, of slightly more than half the height of the hole, and is about the shortest tail. The tail 20B extends along most of the depth of the hole. The tail 20C extends almost to the bottom of the hole, and is about the longest tail within tolerances. All of the tails lengths 20A–20C provide a rugged connection.

In a system that applicant has designed, the insulative plate of each layer has a thickness of 1.25 millimeters, and each complete layer has a thickness D of about 1.30 mm. Each hole 50 has a diameter A of 1.25 mm, which is about the same as the thickness of the layer. Each tail has a width C slightly smaller than the hole diameter, to allow solder to extend all along the depth of the hole between the tail and the plated walls of the hole, with the tail width C being about one millimeter. The tolerances in tail lengths are ±0.25 mm. The faces of the layers carry signal traces and/or ground planes. The layers are held together by epoxy which is shown at 120.

Figure 4:
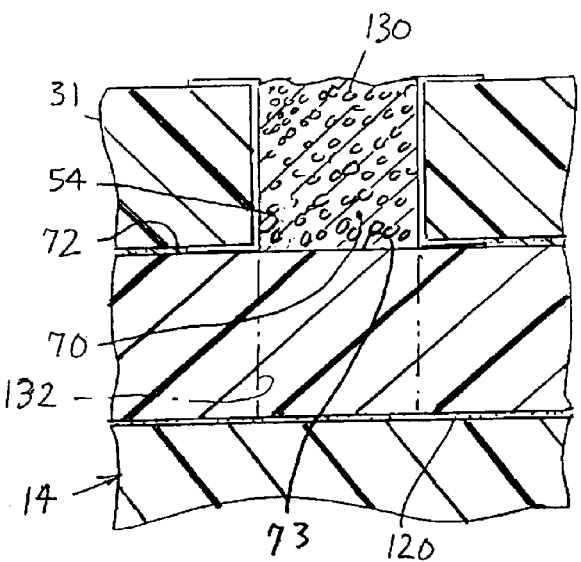
FIG. 4 is a sectional view of the first board portion of FIG. 3 and a portion of the rest of the multi-layer circuit board assembly, and with solder paste lying in a well formed in the first circuit board hole.

FIG. 3 shows a first step in the construction of the termination system. A hole 52 is formed in the first layer 31 and a plating is applied at 54, 60 and 62 to cover the walls of the hole and form trace parts of the top and bottom faces of the layer. Some of the traces such as 60 extend, as shown at 22 in FIG. 1, along the layer to connect the tail 20 to circuit components (which may be connectors) on the board. After the plating process, the layer 31 of FIG. 4 is assembled in a stack of layers 14, that may be held together with a bonding material such as epoxy 120. Then, a quantity 130 of solder paste is placed in the solder well 70 that is formed between the plated walls 54 of the hole and the upper face 72 of the second layer 32 which forms a well bottom 73. Of course, the second layer is not perforated under the well (unless the well extends through the second layer). The solder paste 30 can include multiple tiny balls of solder in a solder flux, or tiny donuts or tubes of solder paste initially placed around the tails, etc. Although applicant shows a solder well 70 extending through one layer it is also possible to form a well 132 that extends through two or more layers, though it does not extend through most of the layers. A solder well can extend through a plurality of layers in order to reach traces on a layer that lies deep under the top of the board assembly.

Figure 5:
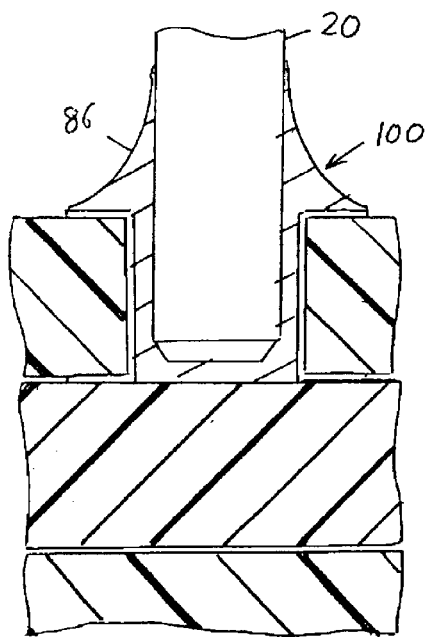
FIG. 5 is an enlarged view of a portion of a component tail and the apparatus of FIG. 4, after the tail has been soldered in place.

In FIG. 5, a component tail 20 has been pressed down into the solder paste, and heat has been applied to melt the solder paste and form the solder joint 100 that includes solder in the hole and the solder fillet 86.

Although terms such as "top", "bottom", etc. have been used to describe the invention as it is illustrated, the invention can be used in any orientation with respect to the Earth.

Thus, the invention provides a termination system that includes the combination of a component and a multi-layer circuit board assembly. The invention provides much of the high strength previously supplied by component tails that extend completely through the circuit board assembly, while avoiding the high capacitance, and provides many of the advantages of SMT (surface mount technology) soldering of low capacitance while providing further advantages of high strength. A hole extends only partially through the circuit board assembly, and usually through only one layer (which may be the uppermost layer during manufacture). The hole forms a well with a well bottom formed by the upper face of the next layer in the stack. A solderable composition such as a solder paste is placed in the well (possibly with the tail) and a component tail is placed in the well and soldered in place. The invention allows the use of uninterrupted routing traces on layers below the top one or two layers, and uses a minimum of solder for easy melting, in addition to the low capacitive coupling and other advantages described above.

Although particular embodiments of the invention have been described and illustrated herein, it is recognized that modifications and variations may readily occur to those skilled in the art, and consequently, it is intended that the claims be interpreted to cover such modifications and equivalents.

What is claimed is:

1. A method for constructing a multilayer circuit board assembly and mounting a component tail to a trace of the assembly, comprising:

constructing the multilayer circuit board assembly by forming holes in a topmost one of the layers of said assembly and plating each hole with a conductive trace;

stacking the boards in a facewise stack and adhering the layers together, including leaving portions of a second board that lies immediately below said topmost board so an upper face of the second board blocks the entire cross-section of each of said holes in said topmost board;

placing a component tail in each of a plurality of said holes and soldering the component tail to the plating of the hole, said step of placing including placing the component tail so its extreme lower end lies a distance above the upper face of said second board, and said step of soldering includes establishing a continuous column of solder in each hole that extends from against the upper face of said second board to above the extreme lower end of the corresponding component tail.

2. Apparatus that includes a combination of a component conductive tail and a multi-layer circuit board assembly that includes a stack of a plurality of layers, including walls forming a hole in a group of said layers that includes at least one layer, wherein said hole extends from a top of a topmost layer of said group to a bottom face of a lowermost layer of said group, said walls of said hole being plated with a hole plating of conductive material, said plurality of layers of said circuit board assembly includes a support layer that lies under said lowermost layer of said group, said support layer having an upper face lying facewise against the lower face of said lowermost layer, said component tail having an end portion lying in said hole, said apparatus including a quantity of solder that lies in said hole and that has been flowed to lie around and bond to said tail end portion and that lies against and bonds to said plating, said support layer having a portion that lies under said hole in said group of layers and that forms the bottom of a solder well that lies within said hole in said group of layers and that holds some of said quantity of solder, wherein:

said component tail has an extreme lower end that is spaced above the bottom of said hole in said group of layers and that lies above the upper face of said support layer;

said quantity of solder includes a first portion that surrounds and is bonded to said component tail end portion and a second portion that is integral with said first portion and that extends directly under said component tail extreme lower end and that is bonded by soldering to said hole plating.

* * * * *